(12) United States Patent
Cernea

(10) Patent No.: US 7,715,235 B2
(45) Date of Patent: May 11, 2010

(54) NON-VOLATILE MEMORY AND METHOD FOR RAMP-DOWN PROGRAMMING

(75) Inventor: Raul-Adrian Cernea, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 18 days.

(21) Appl. No.: 12/197,955

(22) Filed: Aug. 25, 2008

(65) Prior Publication Data

US 2010/0046297 A1  Feb. 25, 2010

(51) Int. Cl.
G11C 16/04 (2006.01)
(52) U.S. Cl. .............................. 365/185.19; 365/189.04
(58) Field of Classification Search ............ 365/185.19, 365/185.04
See application file for complete search history.

(56) References Cited

U.S. PATENT DOCUMENTS

| 5,070,032 | A | 12/1991 | Yuan et al. |
|---|---|---|---|
| 5,095,344 | A | 3/1992 | Harari |
| 5,172,338 | A | 12/1992 | Mehrotra et al. |
| 5,289,401 | A | 2/1994 | Shima |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,701,266 | A | 12/1997 | Fazio et al. |
| 5,768,192 | A | 6/1998 | Eitan |
| 5,903,495 | A | 5/1999 | Takeuchi et al. |
| 6,011,725 | A | 1/2000 | Eitan |

(Continued)

FOREIGN PATENT DOCUMENTS

EP  0 913 832 A1  5/1999

(Continued)

OTHER PUBLICATIONS

EPO/ISA, "Notification of Transmittal of the International Search Report and the Written Opinion of the International Searching Authority, or the Declaration," corresponding International Patent Application No. PCT/US2009/054215, mailed on Nov. 11, 2009, 11 pages.

(Continued)

Primary Examiner—Tuan T. Nguyen
(74) Attorney, Agent, or Firm—Davis Wright Tremaine LLP

(57) ABSTRACT

A ramp-down programming voltage is used to program a group of nonvolatile memory cells in parallel, step by step from a highest step to a lowest step. Overall programming time is improved when a conventional setup for program inhibit together with a verify after each program step are avoided. A program voltage estimate is provided for each cell indicating the programming voltage expected to program the cell to its target. Initially, all but those cells having estimates at or above the current program voltage step will be program-inhibited. Thereafter, with each descending program voltage step, additional cells will be un-inhibited. Once un-inhibited, a cell need not be re-inhibited even if programmed to its target. This is because subsequent program steps are at lower voltages and ineffective in programming the cell beyond its target. The un-inhibit operation in one implementation amounts to simply pulling the associated bit lines to ground.

20 Claims, 17 Drawing Sheets

U.S. PATENT DOCUMENTS

| | | | |
|---|---|---|---|
| 6,046,935 | A | 4/2000 | Takeuchi et al. |
| 6,222,762 | B1 | 4/2001 | Guterman et al. |
| 6,366,496 | B1 | 4/2002 | Torelli et al. |
| 6,614,683 | B1 | 9/2003 | Parker |
| 6,714,448 | B2 | 3/2004 | Manea |
| 7,042,766 | B1 | 5/2006 | Wang et al. |
| 7,095,654 | B2 * | 8/2006 | Quader et al. .......... 365/185.19 |
| 7,151,692 | B2 | 12/2006 | Wu |
| 7,158,413 | B2 | 1/2007 | Kasai et al. |
| 7,366,014 | B2 | 4/2008 | Micheloni et al. |
| 7,414,887 | B2 | 8/2008 | Guterman et al. |
| 7,447,081 | B2 * | 11/2008 | Chan .................... 365/185.22 |
| 7,453,731 | B2 | 11/2008 | Tu et al. |
| 7,508,713 | B2 * | 3/2009 | Sekar et al. ............ 365/185.18 |
| 7,508,715 | B2 | 3/2009 | Lee |
| 7,545,677 | B2 | 6/2009 | Lee et al. |
| 7,551,483 | B2 | 6/2009 | Cernea |
| 7,590,007 | B2 | 9/2009 | Futatsuyama |
| 7,606,084 | B2 * | 10/2009 | Kamei .................. 365/189.09 |
| 7,643,348 | B2 | 1/2010 | Cernea |
| 2002/0191444 | A1 | 12/2002 | Gregori et al. |
| 2003/0002374 | A1 | 1/2003 | Tedrow |
| 2006/0140007 | A1 | 6/2006 | Cernea et al. |
| 2007/0091681 | A1 | 4/2007 | Gongwer et al. |
| 2007/0159891 | A1 | 7/2007 | Tu et al. |
| 2007/0263450 | A1 | 11/2007 | Cernea et al. |
| 2008/0062765 | A1 | 3/2008 | Tu et al. |
| 2008/0253193 | A1 | 10/2008 | Cernea |
| 2008/0253197 | A1 | 10/2008 | Cernea |
| 2008/0310234 | A1 | 12/2008 | Lee et al. |
| 2009/0310418 | A1 | 12/2009 | Cernea |
| 2009/0310419 | A1 | 12/2009 | Cernea |
| 2009/0310420 | A1 | 12/2009 | Cernea |
| 2009/0310421 | A1 | 12/2009 | Cernea |

FOREIGN PATENT DOCUMENTS

| | | |
|---|---|---|
| WO | WO 2008/002832 A2 | 1/2008 |
| WO | WO 2008/002832 A3 | 1/2008 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

Programming into four states represented by a 2-bit code

| Bits/cell | # of States = Ns | Est. # of Program pulses = Np ~ Ns | Est. # of Program pulse train passes | # of states sensed in each verify = Vs | Est. # of Verify Cycles = Nv = k*Np*Vs |
|---|---|---|---|---|---|
| 1 | 2 | 2 | k | 1 | k*2 |
| 2 | 4 | 4 | k | 3 | k*12 |
| 3 | 8 | 8 | k | 7 | k*56 |
| 4 | 16 | 16 | k | 15 | k*240 |
| ... | ... | ... | ... | ... | ... |
| N | $2^N$ | $2^N$ | k | $2^N - 1$ | ~$k*2^{2N}$ |

(k ~ 1 to 4)

Estimated number of program pulses and verify cycles to program a page using conventional alternating program/verify algorithm

FIG. 12

Timing diagram for conventional program inhibit scheme

NON-VOLATILE MEMORY AND METHOD FOR RAMP-DOWN PROGRAMMING

FIELD OF THE INVENTION

This invention relates generally to non-volatile semiconductor memory such as electrically erasable programmable read-only memory (EEPROM) and flash EEPROM, and specifically to memory and programming operations in which the setup time in between each programming step is significantly reduced.

BACKGROUND OF THE INVENTION

Solid-state memory capable of nonvolatile storage of charge, particularly in the faun of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given. EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

The conventional program/verify programming technique is time consuming in at least two respects. First the verify step in between programming steps takes up time. Secondly, after certain memory cells are program-verified, the cells are program-inhibited to prevent further programming by the programming voltage subsequently applied to the page in common. The program inhibition of those certain memory cells requires setting a particular voltage configuration for the bit lines and word lines and involves a length series of precharge operations on the bit lines and word lines.

The first verify issue is exacerbated by the implementation of memory cells capable of storing multiple bits. Essentially verify needs to be performed for each of the possible multiple states of a memory cell. For a memory with 16 possible memory states, this means each verify cycle may incur up to 16 sensing operations. Thus, with increasing number of distinguishable state levels in multi-level memory cells ("MLC"), the verify cycle of the program/verify scheme becomes increasingly time-consuming. Since the conventional programming requires a verify operation in between every pulse, the number of verify operations increases with the square of the number of state partitions. Thus, for memory that hold 3 or more bits of data per cell, the number of verify operations become prohibitively large.

As will be mentioned later, techniques have been proposed to reduce the number of verify operations so as to improve the overall programming performance. However, the second issue remains, i.e., the time-consuming precharge required to set up program inhibition in between programming steps.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

Ramp-Down Programming

According to a general aspect of the invention, a group of memory cells are programmed in parallel by a series of programming steps with descending voltage steps from a predetermined highest level to a second predetermined lowest level. A program voltage estimate is provided for each cell indicating the programming voltage expected to program the cell to its target. Initially, all but those cells having estimates at or above the current program voltage step will be program-inhibited. Thereafter, with each descending program voltage step, additional cells having estimates at or above the current program voltage step will be un-inhibited. Once un-inhibited, a cell is expected to be programmed to its target by the current program step. After it is programmed, it needs not be re-inhibited. The un-inhibit operation in one implementation amounts to simply pulling the associated bit lines to ground.

The program voltage estimate for each cell is estimated from a previous programming experience of the cell. The time consuming inhibit operation only needs to be perfoinied prior to the first program step. Thereafter only an un-inhibit operation is performed before the next program step. Unlike the conventional case, there is no need to inhibit a cell after it has been programmed to its target. This is because subsequent program steps are at lower voltages and ineffective in programming the cell beyond its target. Overall programming time is improved when a conventional setup for program inhibit together with a verify after each program step are avoided.

BRIEF DESCRIPTION OF THE DRAWINGS

FIG. 7 illustrates schematically a preferred organization of the sense modules shown in. FIG. 6.

FIG. 12 is a table illustrating estimated numbers of programming pulses and verifying cycles to program a page using conventional alternating program/verify algorithm.

DETAILED DESCRIPTION OF THE PREFERRED EMBODIMENTS

Memory System

FIG. 1 to FIG. 12 provide example memory systems in which the various aspects of the present invention may be implemented or illustrated.

FIG. 13 to FIG. 20 illustrate context and details of the various aspects and embodiments of the present invention.

Figure 1:
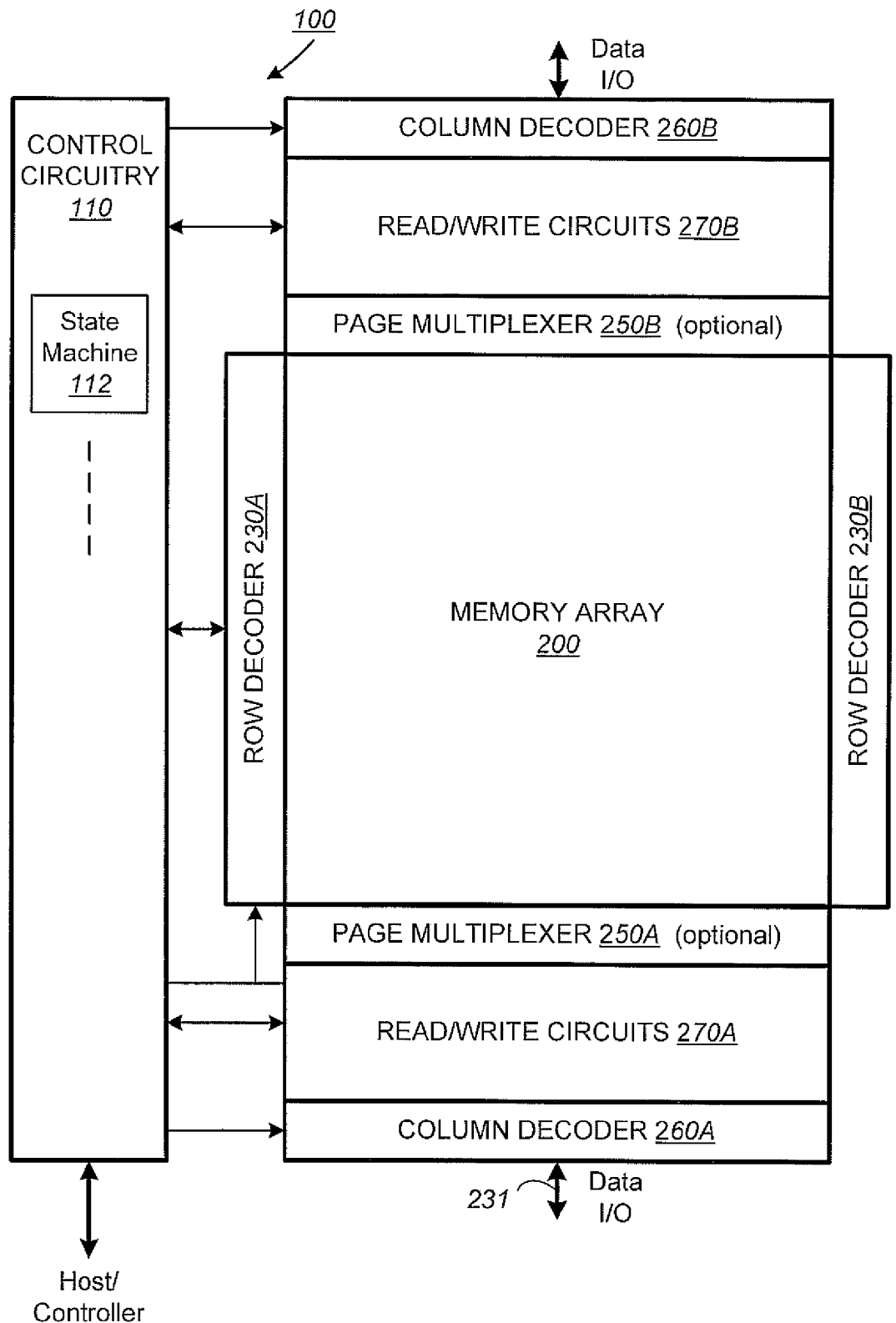
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
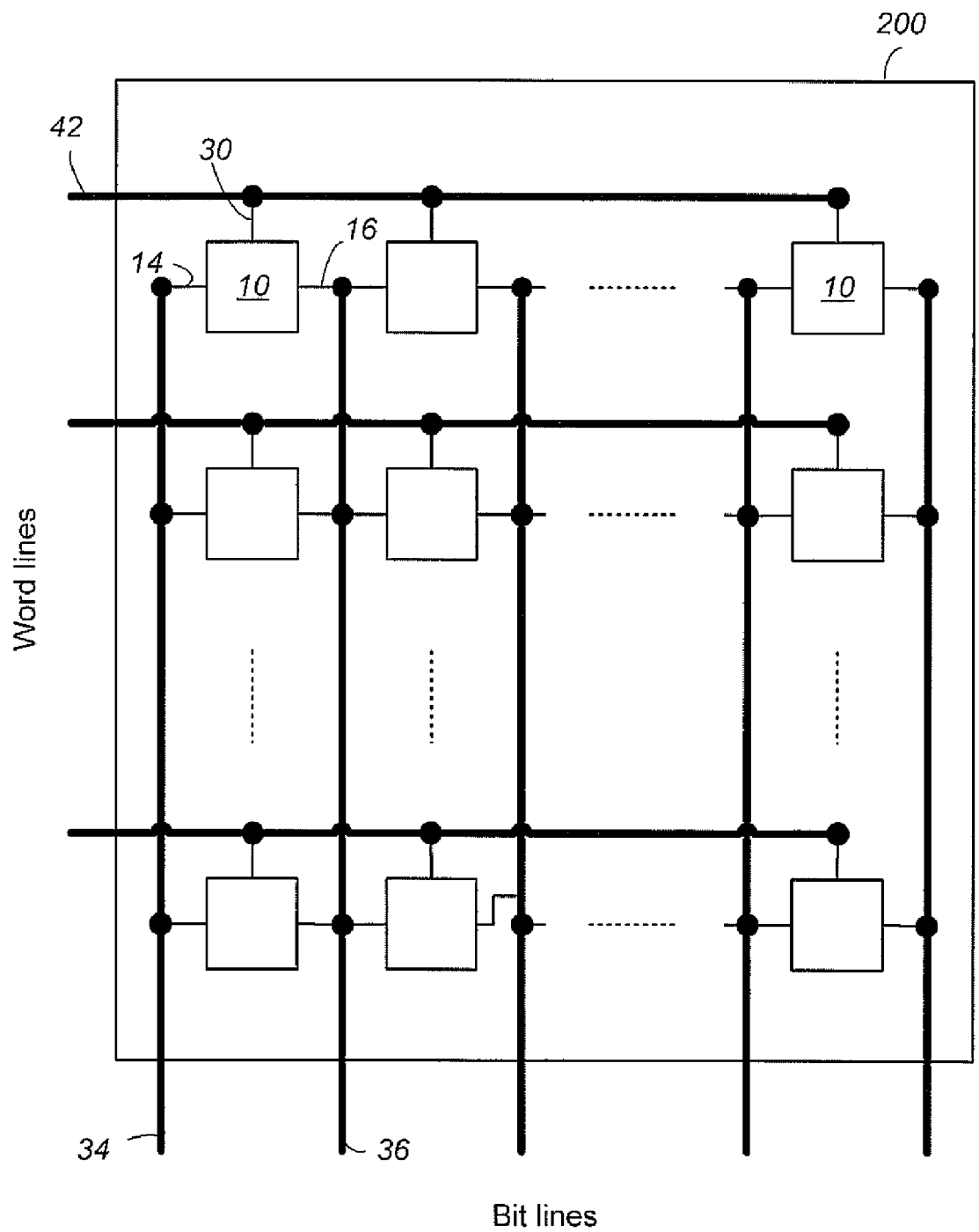
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
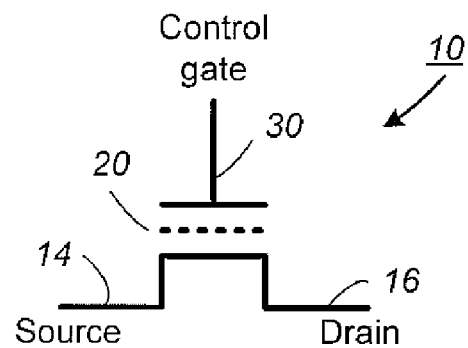
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
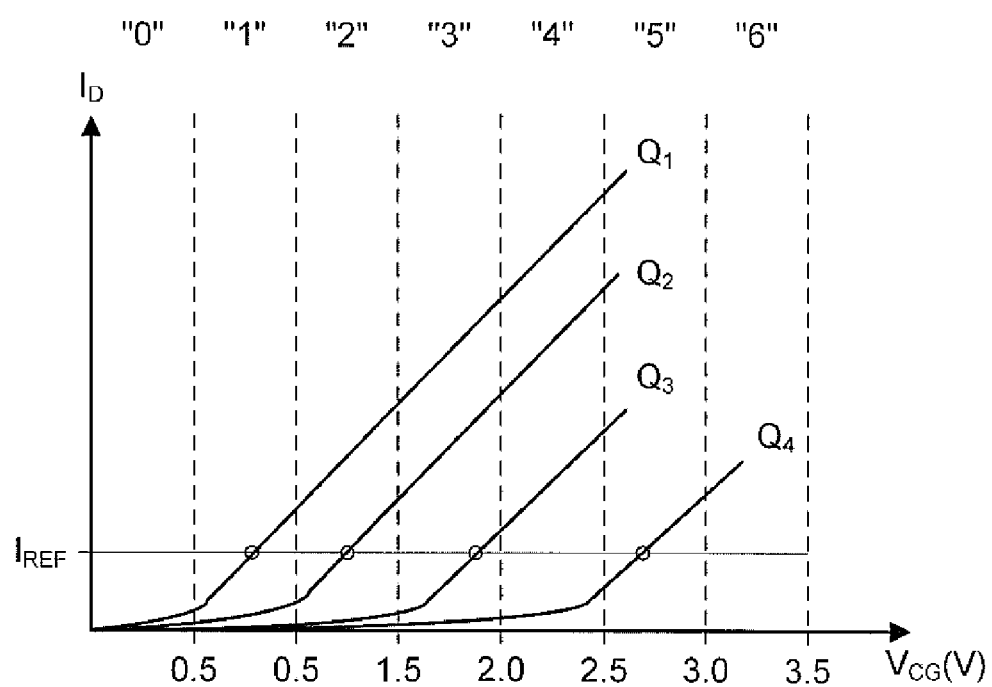
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
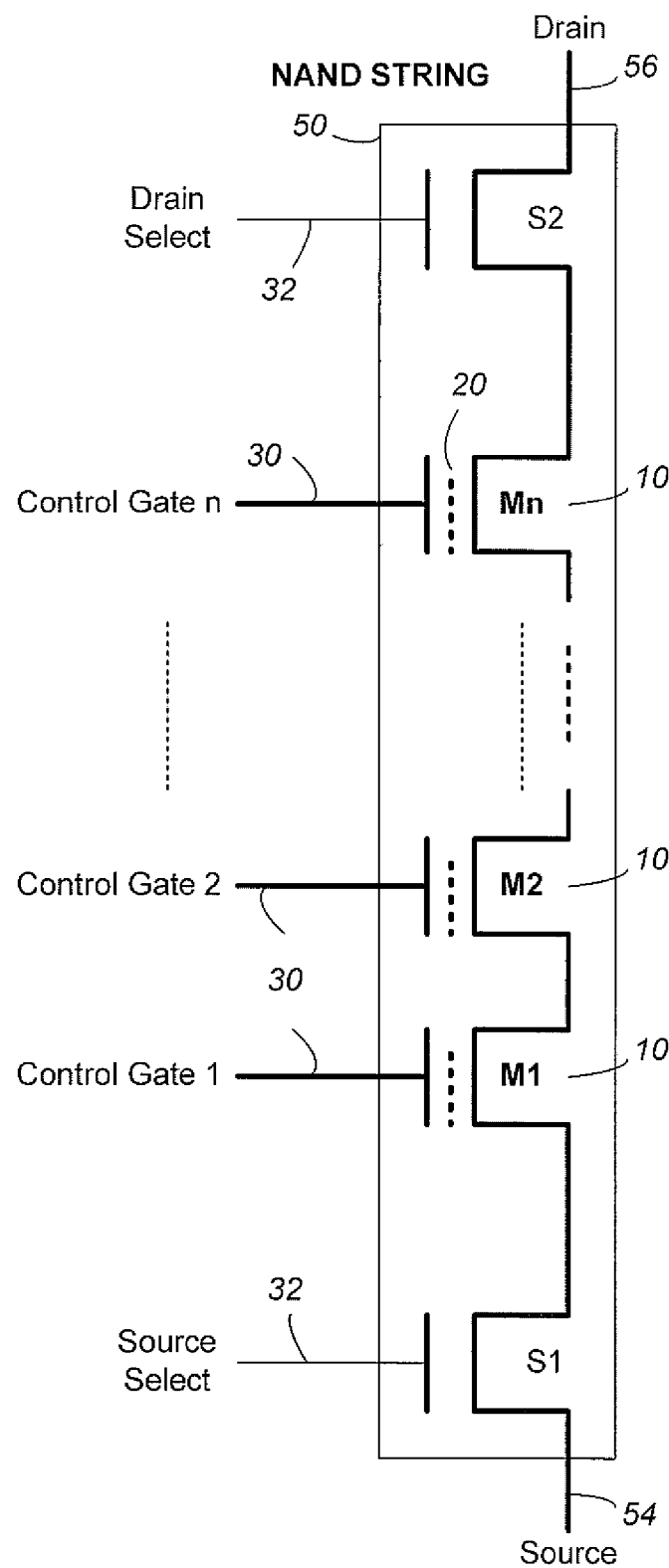
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
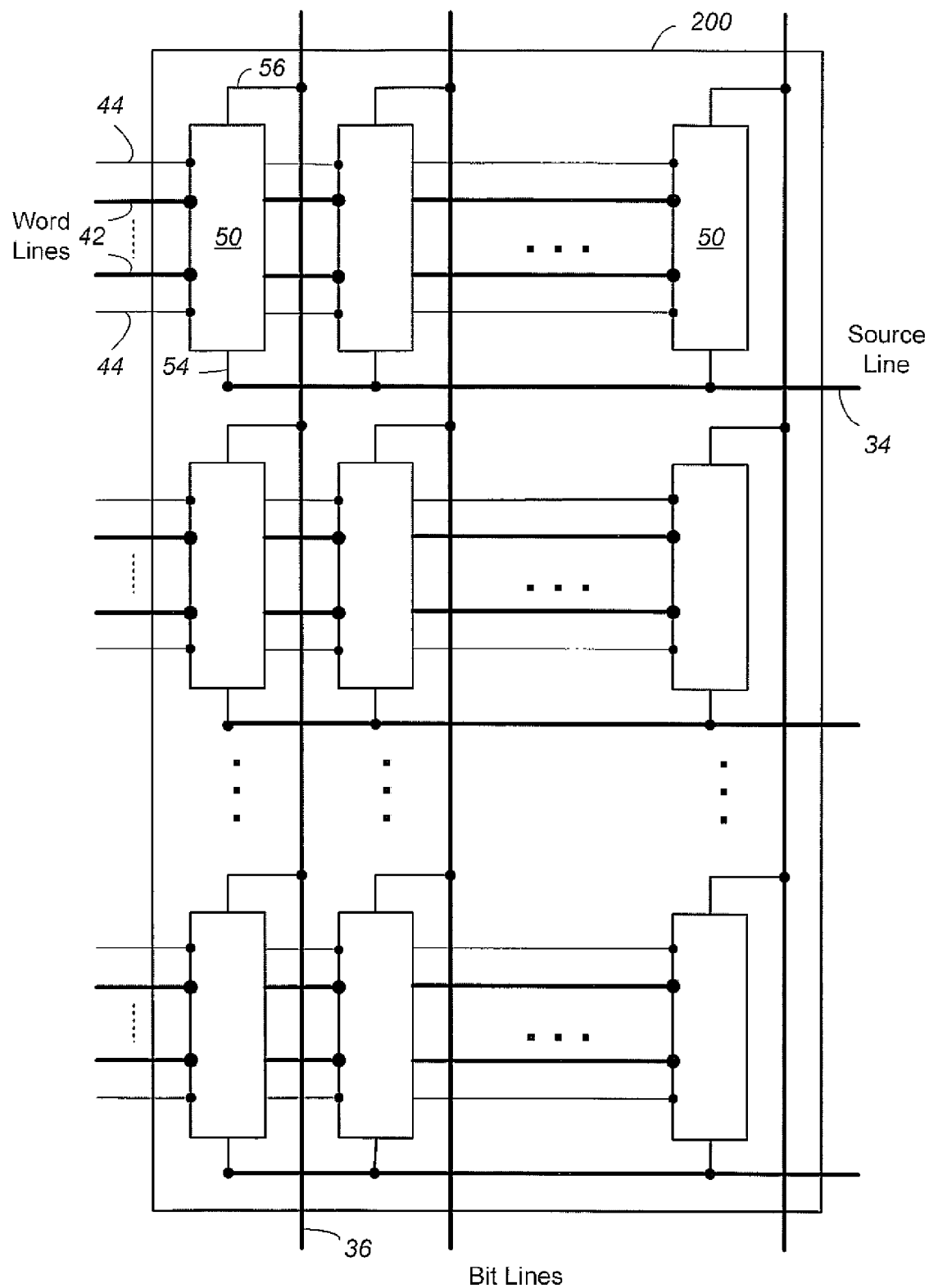
FIG. 5B illustrates an example of an NAND array 200 of memory cells, constituted from NAND strings 50 such as that shown in FIG. 5A.

FIG. 5B illustrates an example of an NAND array 200 of memory cells, constituted from. NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
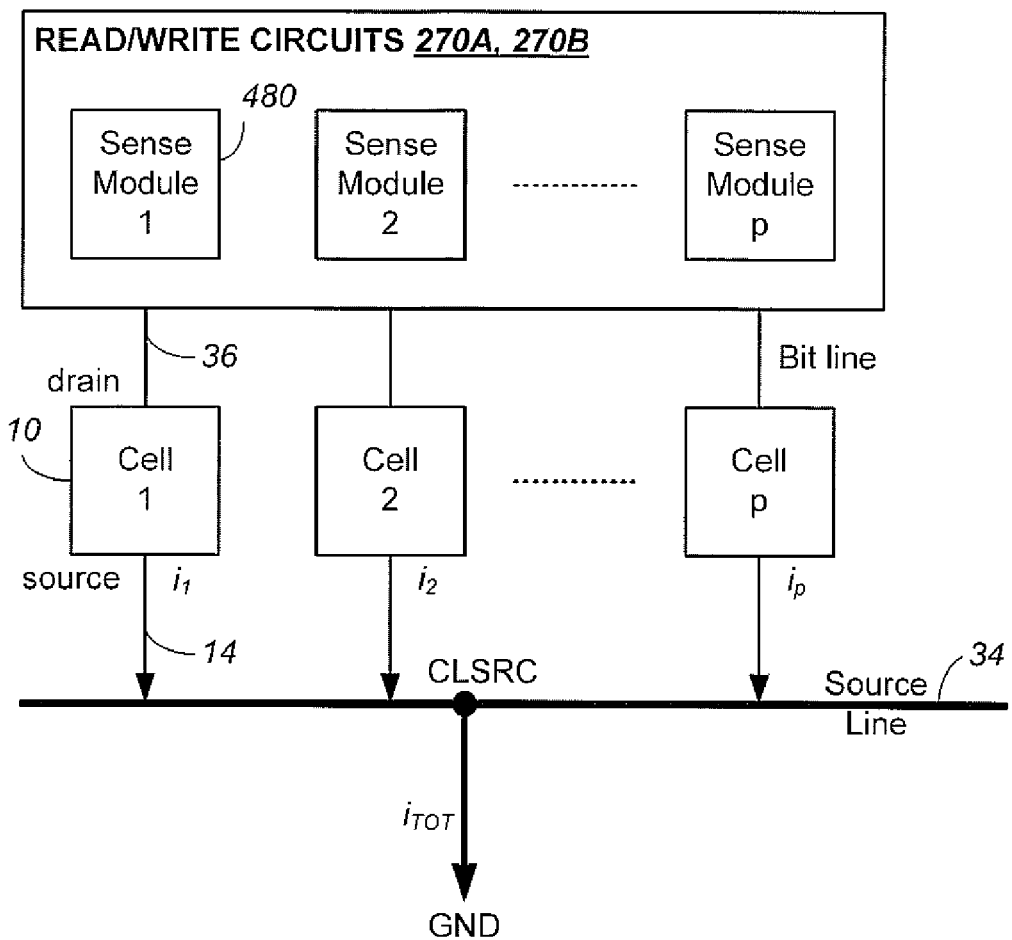
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, ..., sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
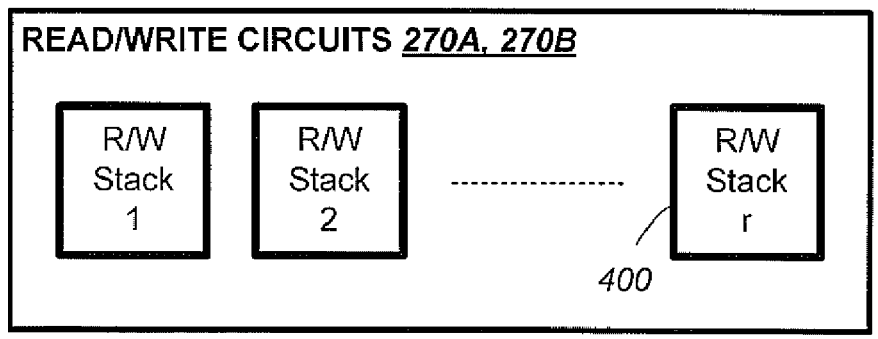

FIG. 7 illustrates schematically a preferred organization of the sense modules shown in FIG. 6. The read/write circuits 270A and 270B containing p sense modules are grouped into a bank of read/write stacks 400.

Figure 8:
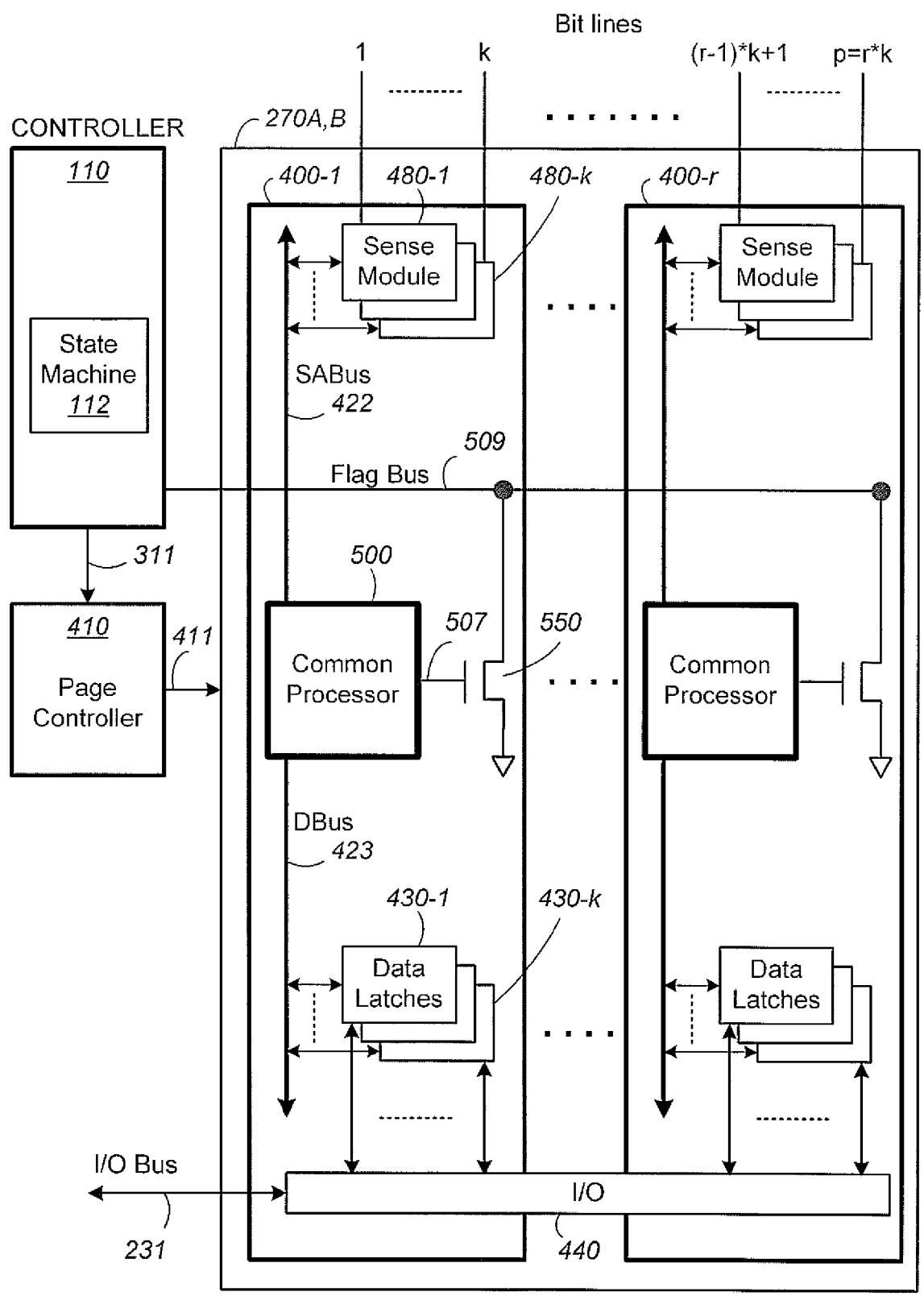
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, ..., 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack. The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
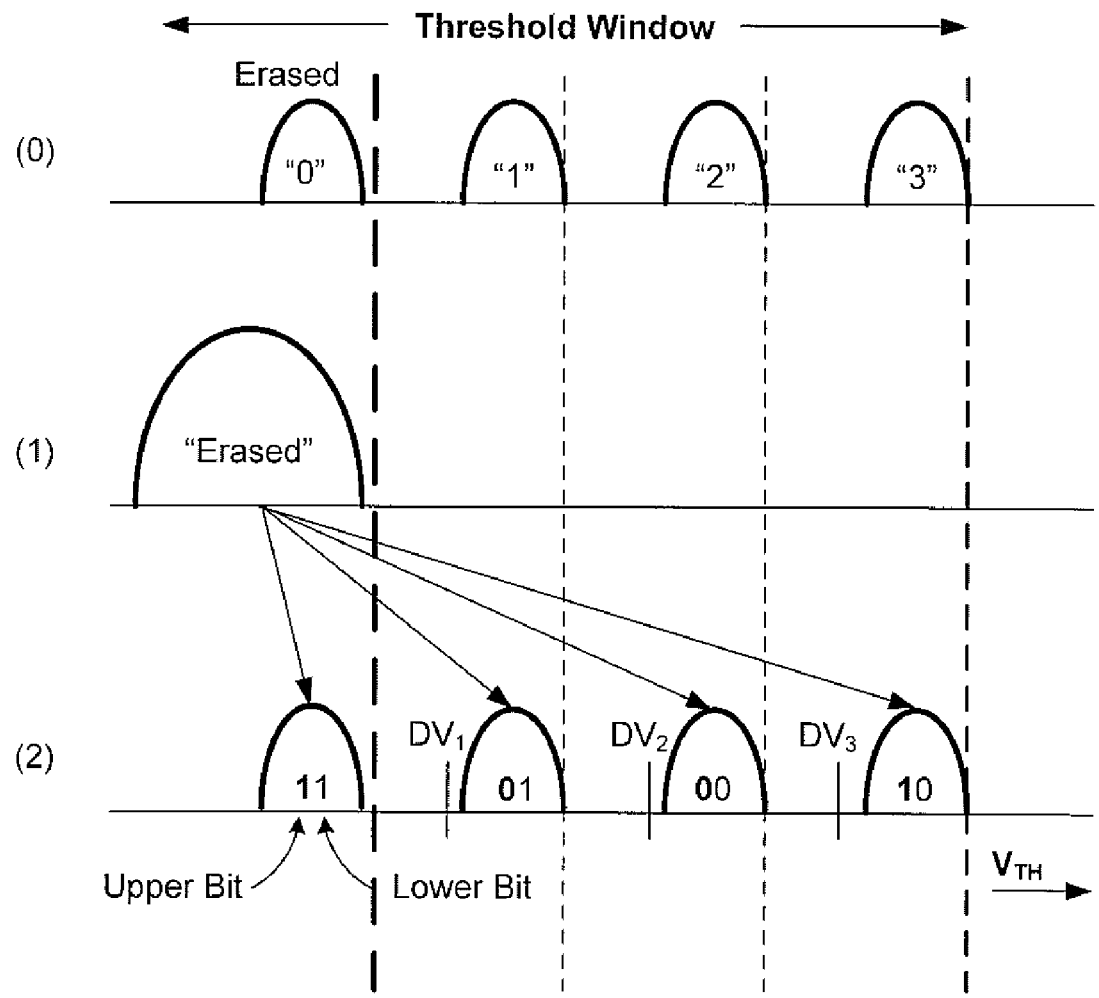
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $DV_1$, $DV_2$ and $DV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $DV_1$, $DV_2$ and $DV_3$ in three sub-passes respectively.

Figure 10:
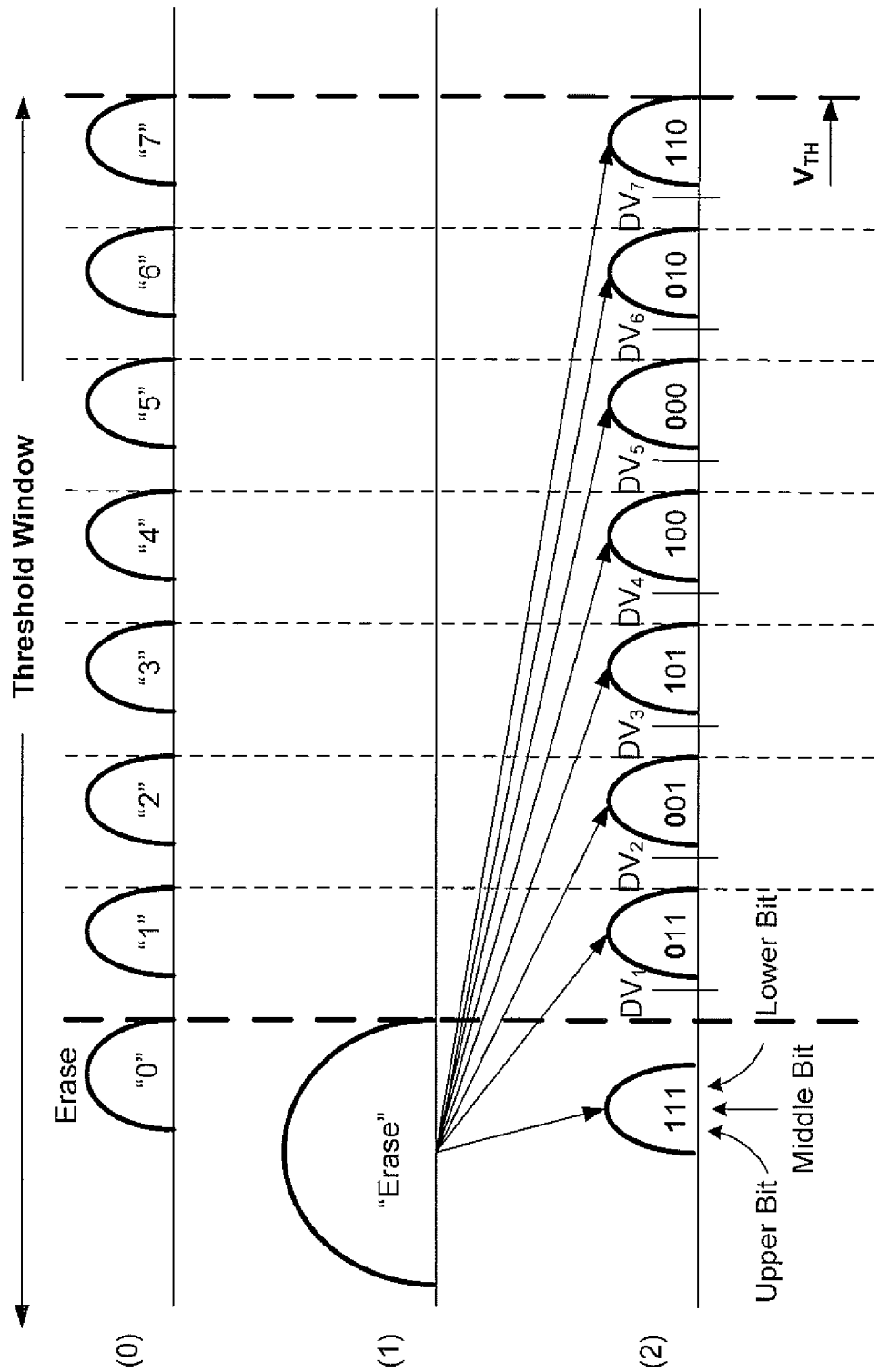
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $DV_1$-$DV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $DV_1$, -$DV_7$ in seven sub-passes respectively.

Page or Word-line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Figure 11:
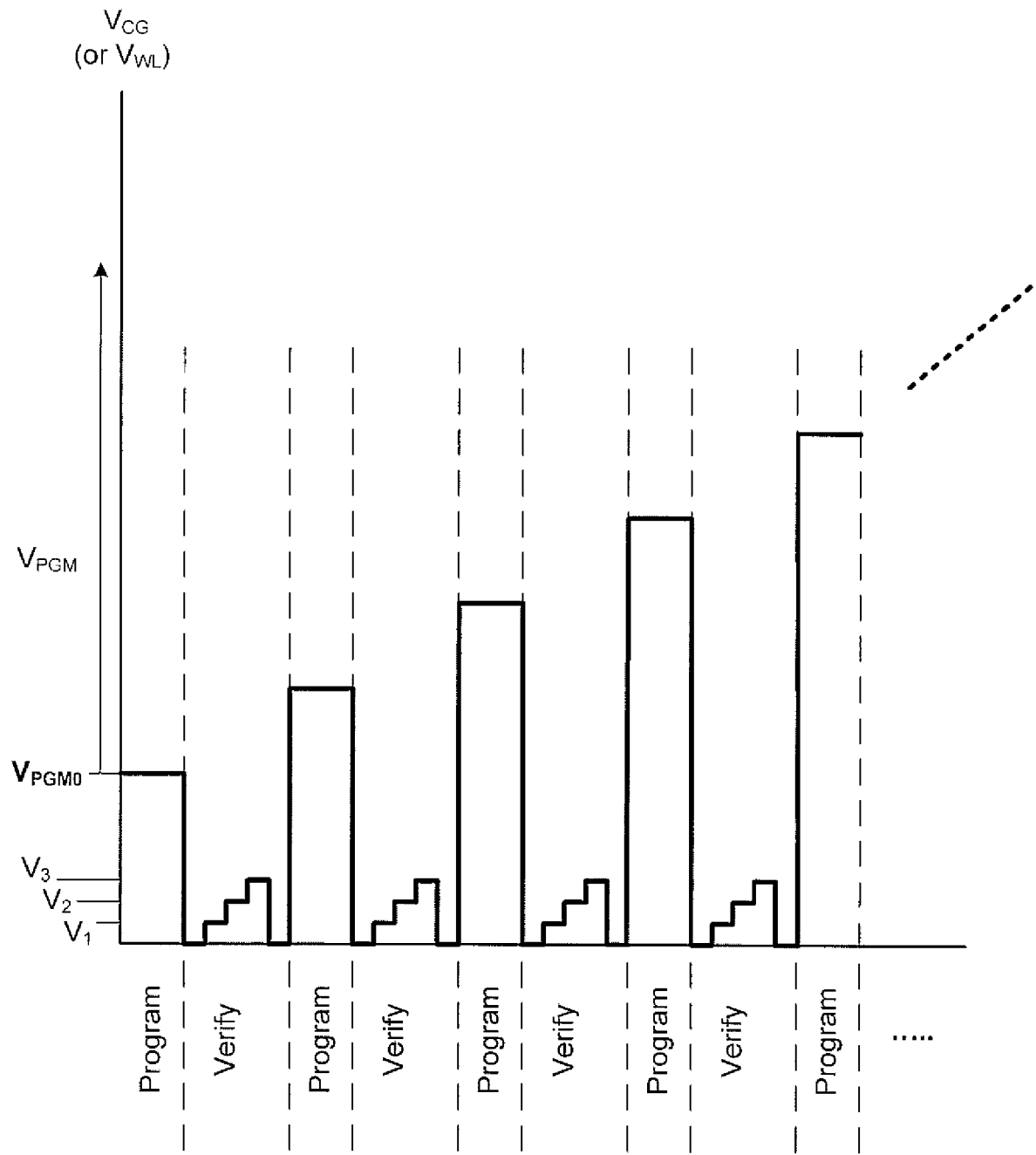
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with the partitioning of a memory into increasing number of states; the verify cycle of the program/verify scheme becomes increasingly time-consuming.

FIG. 12 is a table illustrating estimated numbers of programming pulses and verifying cycles to program a page using conventional alternating program/verify algorithm. For example, for an N-bit memory, the partitioning is into $Ns=2^N$ states. The number of program pulses is at least the same of the number of states Ns. Some algorithm may require k programming passes, where k may be 1 to 4.) For multi-state memory, each verify operation is further multiplied by $2^N-1$, one for each programmed state. Thus, the estimated number of verified is proportional to $2^{2N}$, which is the square of the number of states. As can be seen from the table, for a 3-bit cell, the nominal number of verify cycles is already extremely high, and that is not including additional sensing required in other schemes. For 4-bit cell, the number of verify cycle is prohibitive.

Techniques have been disclosed to reduce the number of verify steps so as to improve the overall programming performance. Basically, each memory cell is programmed to its target threshold using an estimate programming voltage. In this way, no verify is required after the programming step.

Ramp-Down Programming Techniques

While the above-mentioned techniques help to reduce the number of verify steps in between programming steps, the issue of program inhibit between programming steps remains.

According to a general aspect of the invention, the program inhibit step in between programming steps is significantly simplified by a ramp-down programming technique thereby improving overall programming performance.

Figure 13:
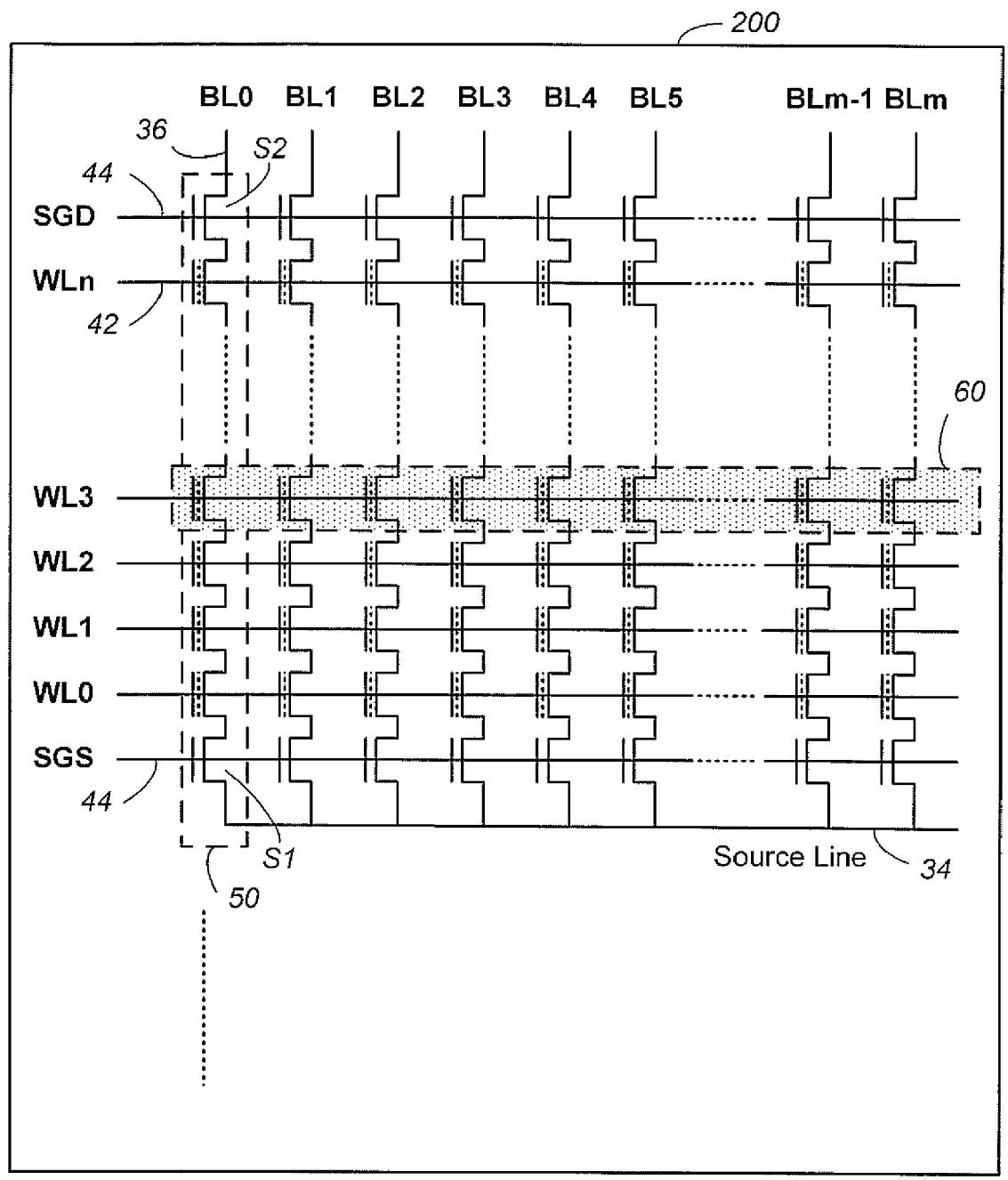
FIG. 13 illustrates a page of memory cells organized, for example in the NAND configuration, being programmed in parallel.

FIG. 13 illustrates a page of memory cells organized, for example in the NAND configuration, being programmed in parallel. FIG. 13 essentially shows a bank of NAND chains 50 from the memory array 200 of FIG. 5B, where the detail of each NAND chain is shown explicitly as in FIG. 5A. A "page" such as the page 60, is a group of memory cells programmable in parallel, made possible by the control gates of the cells connected in common to a word line 42 and each cell accessible by a sensing circuit (e.g., sense module 480 shown in FIG. 8) accessible via a bit line 36. As an example, when programming the page of cells 60, a programming voltage is applied to the common word line WL3. Prior to programming, those cells that have already been programmed to their target states are programmed inhibited. This is accomplished by effectively reducing the voltage difference between the control gate and the channel region of the cell in order to discourage electrons from tunneling from the source to the floating gate (see FIG. 2.)

Figure 14:
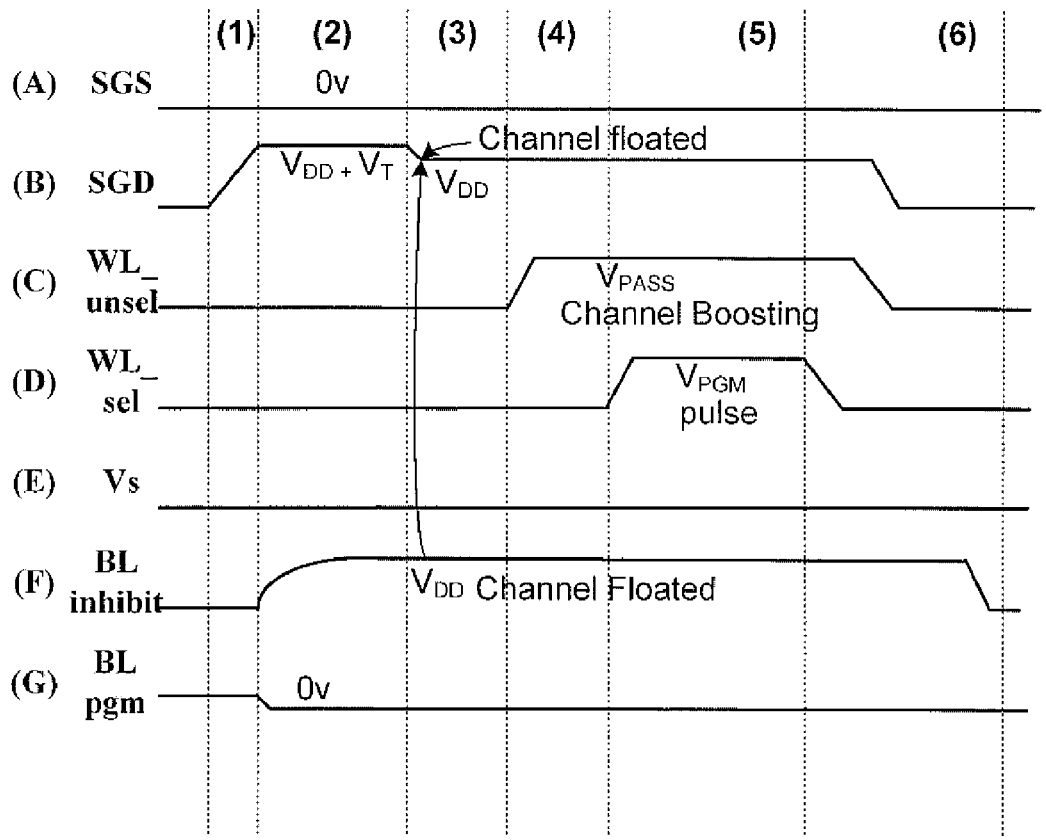
FIG. 14 is a timing diagram showing schematically one cycle of a conventional program step.

FIG. 14 is a timing diagram showing schematically one cycle of a conventional program step. The cycle includes a program inhibit phase, involving bit lines precharge and word lines precharge in order to set up the condition for program inhibit or program enable. Once the bit line and word lines voltages are set up, a program phase involving the application of a program voltage to the selected word line can take place. Thereafter, the bit lines and word lines are reset in a discharge phase to get ready for the next cycle.

FIG. 14 illustrates the program inhibit phase in four sub-phases. (1) The source select transistor S1 (FIG. 13) is turned off by SGS at 0V (FIG. 14(A)) while the drain select transistor S2 (FIG. 13) is turned on by SGD going high to at least $Vdd+V_T$ (FIG. 14(B)), thereby allowing a bit line to access a NAND chain. (2) The bit line voltage of a program inhibited NAND chain is raised to a predetermined voltage given by Vdd (FIG. 14(F)). This predetermined voltage is sufficient to turn off the drain select transistor S2 and cut off the drain of the NAND chain from its bit line when SGD drops to Vdd in (3), thereby floating the channels therein. At the same time, the bit line voltage of a programming NAND chain is fixed at 0V (FIG. 14(G)). (3) The drain word line connecting to SGD of the control gates of the drain select transistors of a row of NAND chains has its voltage drop to Vdd. This will float those program inhibited NAND chains where their drain select transistors are turned off because their bit line voltage is comparable to Vdd (FIGS. 14(B) & 14(F)). On the other hand, the NAND chains with a memory transistor to be programmed will not have their drain select transistors turned off since their drain is at 0V due to the bit line voltage.

Thus after sub-phase (3), due to the bit lines being at Vdd, those NAND chains will have their drain select transistor turned off and their channel floated. Similarly, due to the bit blines being at 0V, those other NAND chains will have their drain select transistor turned on and their channel at 0V. In sub-phase (4), the un-selected word line of the NAND chain is raised to $V_{PASS}$ (FIG. 14(C)). Since the channel of a program inhibited NAND chain is floating, its channel voltage is boosted by being coupled high towards $V_{PASS}$. This will reduce the potential difference between the source and the charge storage elements of the memory cell, thereby inhibiting programming. On the other hand, those NAND chains with their bit line at 0V will have their channel at 0V, a condition conducive to programming.

After each cell has been set up to be either in a program enable or program inhibit mode, a programming voltage can then be applied to the common selected word line in the Program sub-phase (5) (FIG. 14(D)). The cells under program inhibition (i.e., with boosted channels and bit line voltage at Vdd) will not be programmed.

In sub-phase (6) after the programming voltage step, the bit lines and word lines have their voltages discharged to be ready for the next step in the cycle.

Conventionally, the next step is a verify step which is to sense the memory cells to determine if each has been programmed to its target. This will require a resetting of the bit line and word line voltages to another configuration suitable for sensing. After the verify step, the respective sets of memory cells to be program inhibited and program enabled are known and the cycle of program inhibit, program pulse and verify repeats until all the cells of the group are program-verified.

Figure 15:
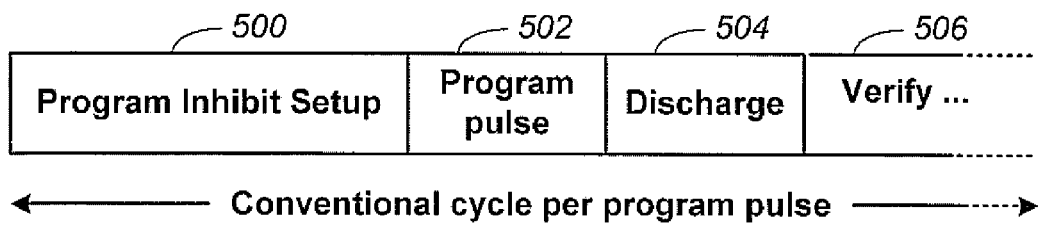
FIG. 15 illustrates schematically the timing of a conventional cycle involving a programming pulse.

FIG. 15 illustrates schematically the timing of a conventional cycle involving a programming pulse. As is clear from the description in connection with FIG. 14, each program step 502 is preceded by a setup step 500 for program inhibit and followed by a bit line/word line discharge step 504 and then a recharge verify step 506. In typical programming pass ramping up from a low to a high programming voltage, there will be tens of programming steps and the cycle illustrated in FIG. 15 is repeated at every step.

Even when the verify step 506 can be dispensed with, as disclosed in co-pending U.S. patent application Ser. No. 12/138,371, filed on 12 Jun. 2008, the program inhibit phase 500 still consumes a significant portion of time in the cycle.

Figure 16:
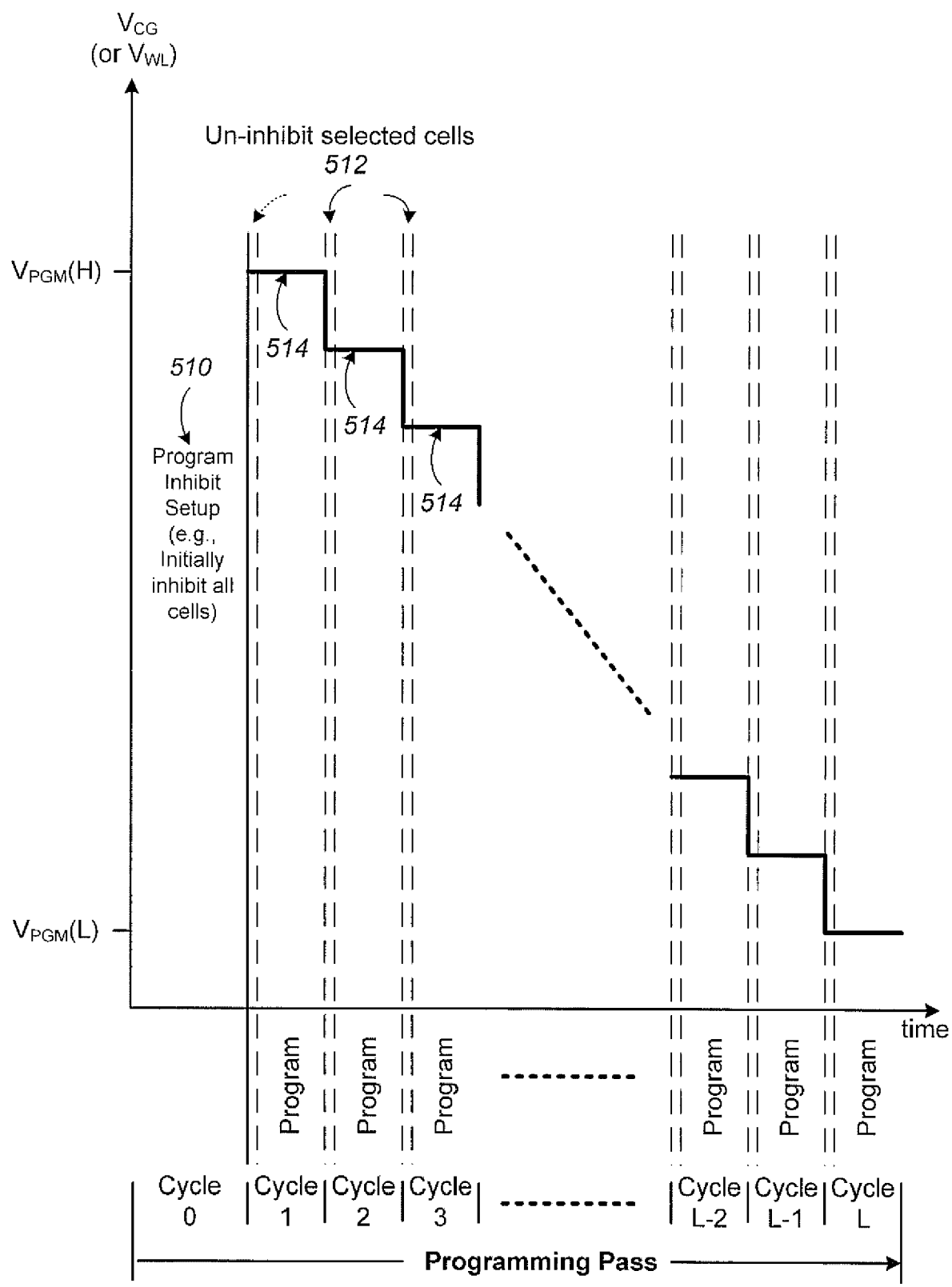
FIG. 16 illustrates a ramp-down programming waveform, according to one embodiment of the invention.

FIG. 16 illustrates a ramp-down programming waveform, according to one embodiment of the invention. The present programming scheme programs a group of memory cells in parallel by subjecting them to a programming voltage waveform step by step, with decreasing voltage level at each successive step. Each memory cell of the group is provided with a program voltage estimate so that each can be programmed at the estimate voltage level without trail and error and the need to verify afterwards.

Initially, all the memory cells of the group are set to a program-inhibit mode in a step 510 similar to step 500. At the beginning of each program step 514, an un-inhibit step 512 takes place where those memory cells with estimates at or above the current programming voltage step are changed from the inhibit mode to an un-inhibit mode (i.e., program enable mode.) The programming is performed in a programming pass step by step from a predetermined highest level $V_{PGM}(H)$ to a predetermined lowest level $V_{PGM}(L)$ designed to adequately and efficiently program the group of memory cells to their respective targets. The application of the programming voltage and Vpass to the word lines and the pre-charging of the bit lines are performed by the read/write circuits 270A and 270B under the control of the controller 110 (see FIG. 1 and FIG. 8.)

The program voltage estimate is obtained from a "program index" for the cell which is derived from a previous programming of the cell. Such a technique is disclosed in co-pending U.S. patent application Ser. No. 12/138,371, "METHOD FOR INDEX PROGRAMMING AND REDUCED VERIFY IN NONVOLATILE MEMORY" filed on 12 Jun. 2008 by the same inventor as the present application and in co-pending U.S. patent application Ser. No. 12/138,378, "NONVOLATILE MEMORY WITH INDEX PROGRAMMING AND REDUCED VERIFY" filed on 12 Jun. 2008 by the same inventor as the present application. The entire disclosures of the two above-mentioned applications are incorporated herein by reference.

Alternatively, the program voltage estimate for each memory cell can also be obtained by a "predictive programming" technique. Predictive programming calibrated by one or more checkpoint is also disclosed in co-pending U.S. patent application Ser. No. 11/733,694, "PREDICTIVE PROGRAMMING IN NON-VOLATILE MEMORY" filed on 10 Apr. 2007 by the same inventor as the present application, and in co-pending U.S. patent application Ser. No. 11/733,706, "NON-VOLATILE MEMORY WITH PREDICTIVE PROGRAMMING" filed on 10 Apr. 2007 by the same inventor as the present application. The entire disclosures of the two above-mentioned applications are incorporated herein by reference.

Figure 17:
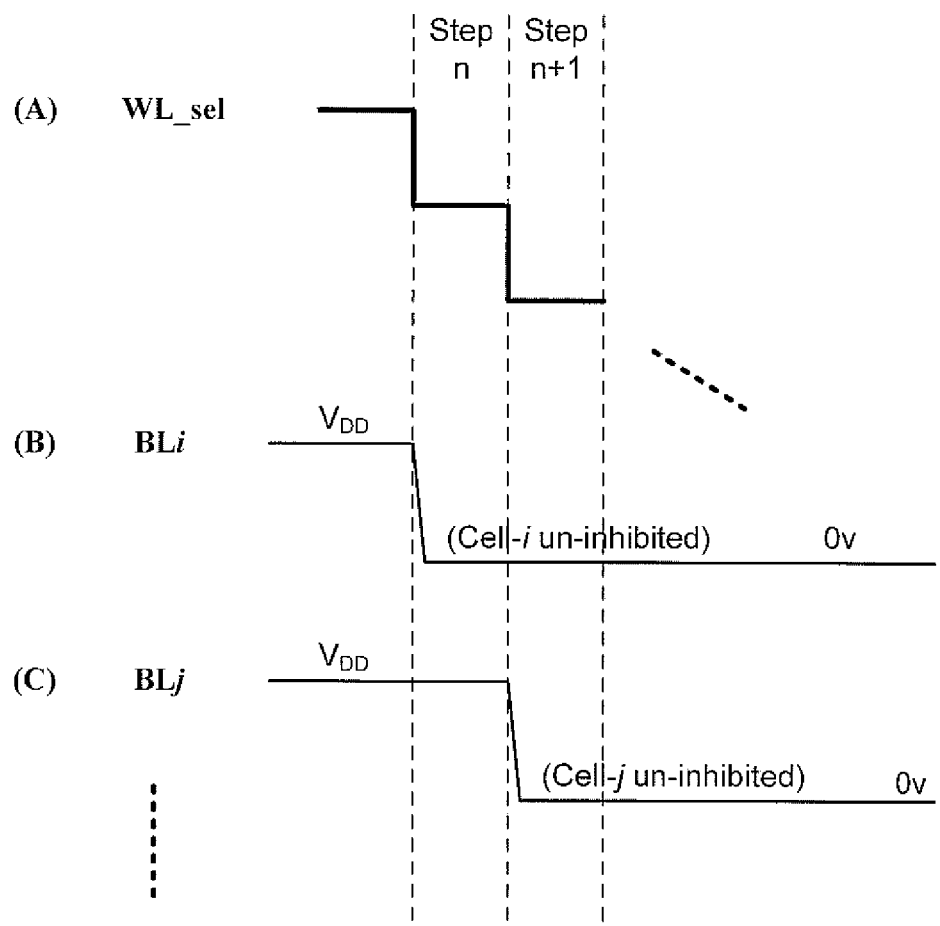
FIG. 17 is a timing diagram illustrating the step of changing a memory cell from a program inhibit mode to an un-inhibit mode.

FIG. 17 is a timing diagram illustrating the step of changing a memory cell from a program inhibit mode to an un-inhibit mode. Essentially, those memory cells with a program voltage estimate at or above the current voltage step level are to be un-inhibited. For example, in program step n, a memory cell i is to be changed from program inhibit mode to the un-inhibit mode. This merely involves pulling the associated bit line BLi from Vdd to ground 0V (FIG. 17(B)). Similarly, in program step n+1, another memory cell j is to be changed from program inhibit mode to the un-inhibit mode, and the associated bit line BLj is pulled from Vdd to ground. As is evident from the discussion in connection with FIG. 13 and FIG. 14, when the bit line 36 of a NAND chain 50 is below the gate voltage of the drain select transistor S2 by $V_T$, the drain select transistor S2 is turned on. This will discharge the boosted voltage in the channels of the NAND chain to ground via the bit line 36, thereby rendering the NAND chain program enabled.

It should be appreciated that the present scheme does not call for the memory cell to be inhibited once it is programmed to its target as in the conventional case. This is because the use of a ramp-down programming scheme has the cells with highest target threshold programmed first followed by ones with lesser and lesser target thresholds. Thus, unlike conventional ramp-up programming (such as one shown in FIG. 11), there is no need to program-inhibit a programmed cell to prevent it from further programming since the subsequent programming voltage will be lower and ineffective in programming further a cell that has previously been subject to a higher programming voltage. In this way, as the programming voltage is ramped down step by step reaching the program voltage estimate of certain cells, those certain cells will be program-enabled. Stepping down, more and more of the memory cells of the group are changed from the inhibit mode to the un-inhibit mode and never the other way. This considerably simplifies and shortens the operation in between each programming step 514 as only a bit line pull-down is required in step 512.

Figure 18:
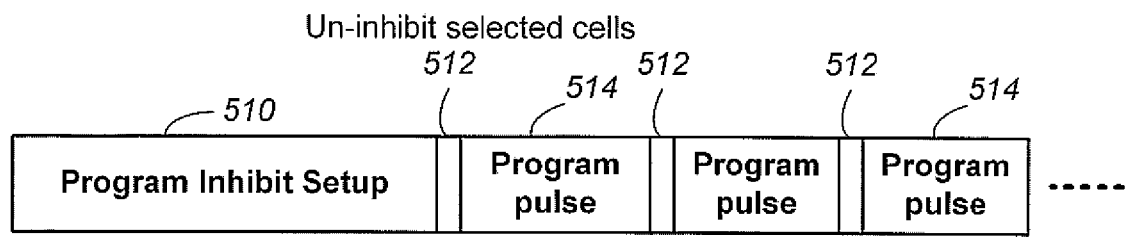
FIG. 18 illustrates schematically the sequence of steps according to one embodiment of the present invention.

FIG. 18 illustrates schematically the sequence of steps according to one embodiment of the present invention. A programming pass starts with the program inhibit setup step 510 in which all cells of the group are put into the program inhibit mode. The step 510 corresponds to cycle 0 in FIG. 16 which is the most time consuming cycle but need only be perform once in the programming pass. Before each program step 514, those memory cells with a program voltage estimate at or above the current program voltage level are changed from the inhibit to the un-inhibit mode in the un-inhibit step 512. The steps 512 and 513 are repeated every cycle (e.g., cycle 1, 2, . . . in FIG. 16), program step by program step until the last program step is processed.

Figure 19:
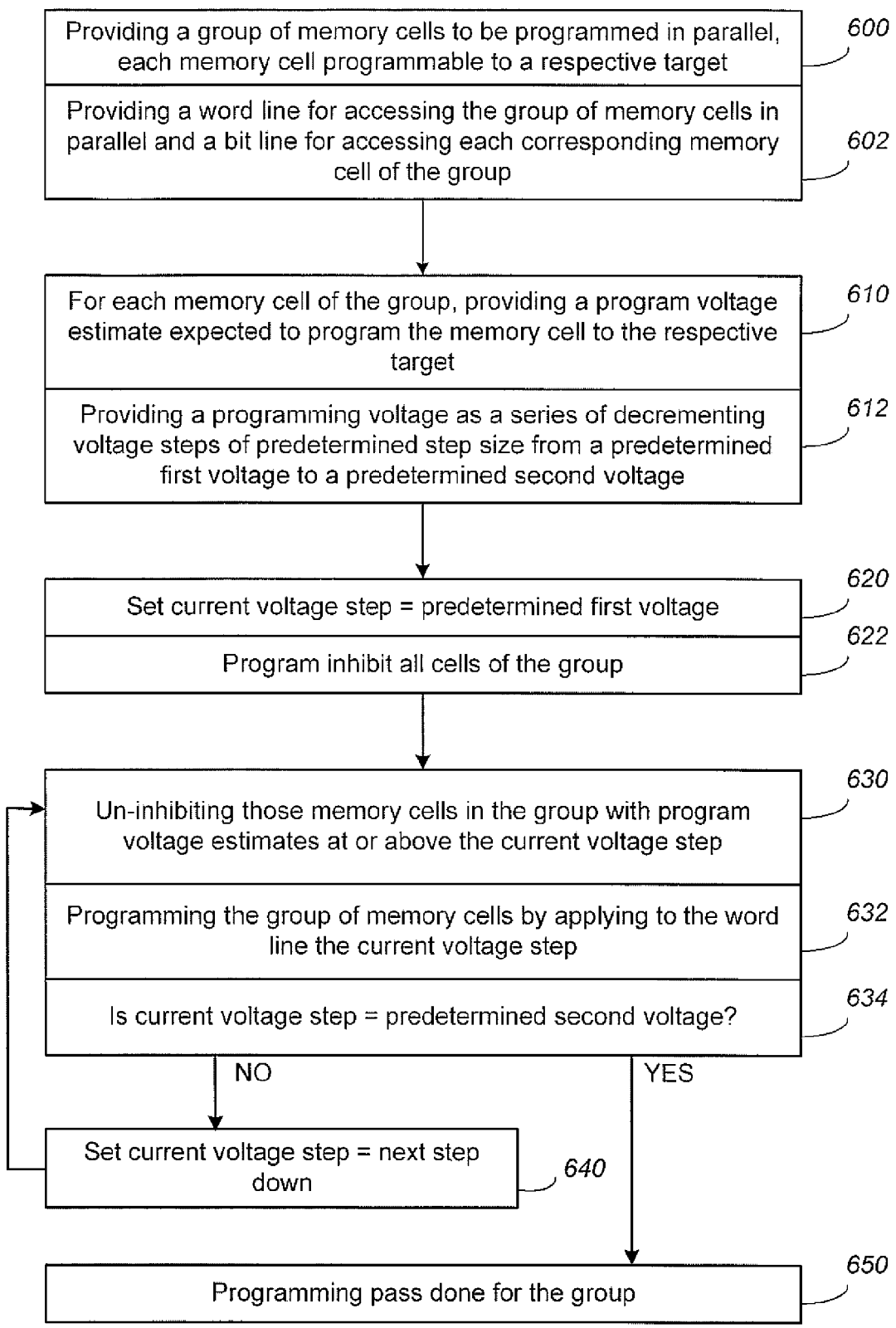
FIG. 19 is a flow diagram illustrating the programming scheme of FIG. 18.

FIG. 19 is a flow diagram illustrating the programming scheme of FIG. 18.

STEP 600: Providing a group of memory cells to be programmed in parallel, each memory cell programmable to a respective target.

STEP 602: Providing a word line for accessing the group of memory cells in parallel and a bit line for accessing each corresponding memory cell of the group.

STEP 610: For each memory cell of the group, providing a program voltage estimate expected to program the memory cell to the respective target.

STEP 612: Providing a programming voltage as a series of decrementing voltage steps of predetermined step size from a predetermined first voltage to a predetermined second voltage.

STEP 620: Set current voltage step equal to the predetermined first voltage.

STEP 622: Program inhibit all cells of the group.

STEP 630: Un-inhibiting those memory cells in the group with program voltage estimates at or above the current voltage step.

STEP 632: Programming the group of memory cells by applying to the word line the current voltage step.

STEP 634: Is current voltage step equal to the predetermined second voltage? If so proceed to STEP 650, otherwise proceed to STEP 640.

STEP 640: Set current voltage step equal to the next step down. Proceed to STEP 630.

STEP 650: Programming pass done for the group.

In another embodiment, the first iteration of the STEP 630 is merged with the STEP 622 so that the two steps are performed as a single step of program inhibiting all cells of the group except those to be un-inhibited in the first iteration of the STEP 630.

Figure 20:
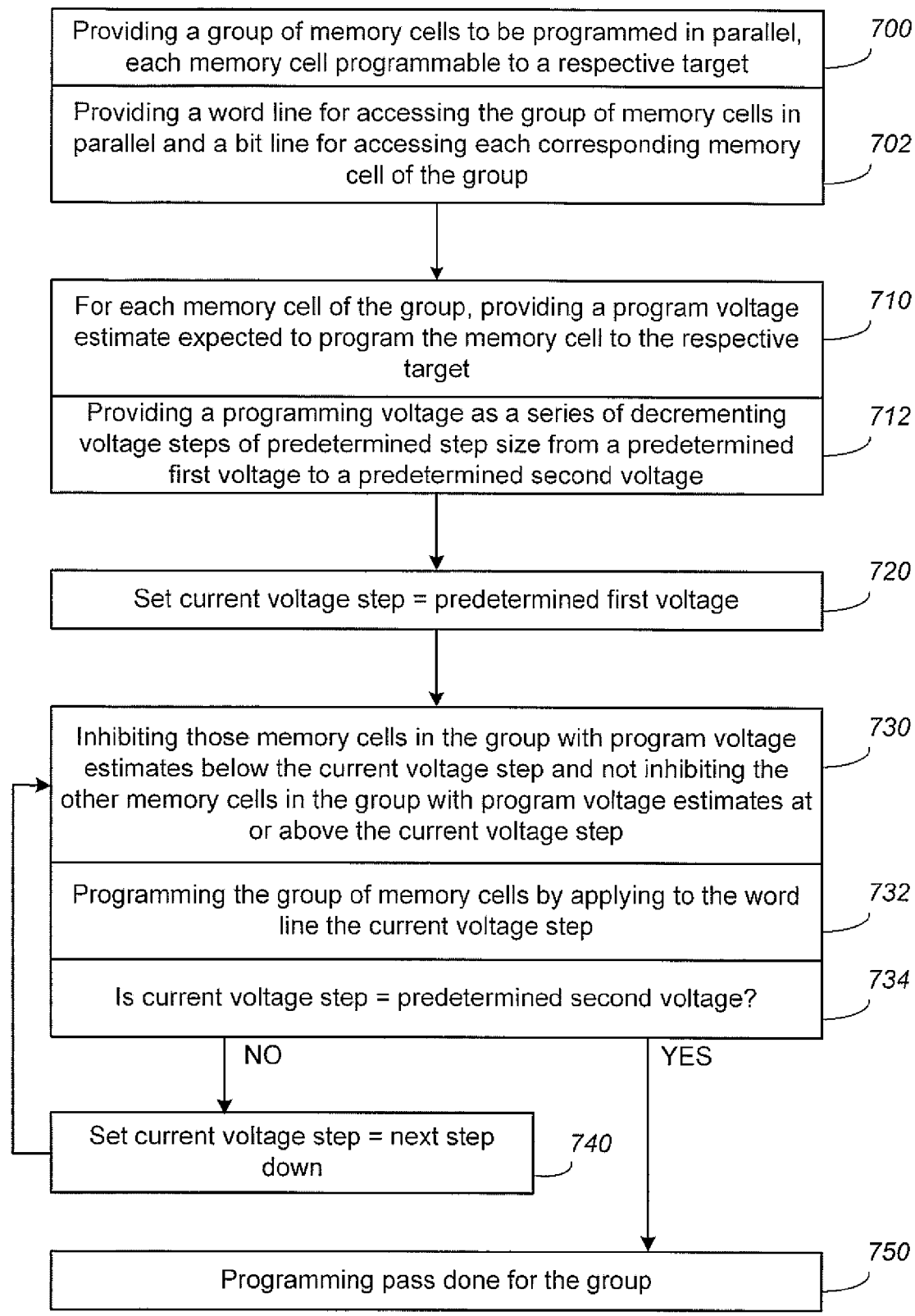
FIG. 20 is a flow diagram illustrating the programming scheme according to a general aspect of the invention.

FIG. 20 is a flow diagram illustrating the programming scheme according to a general aspect of the invention.

STEP 700: Providing a group of memory cells to be programmed in parallel, each memory cell programmable to a respective target.

STEP 702: Providing a word line for accessing the group of memory cells in parallel and a bit line for accessing each corresponding memory cell of the group.

STEP 710: For each memory cell of the group, providing a program voltage estimate expected to program the memory cell to the respective target.

STEP 712: Providing a programming voltage as a series of decrementing voltage steps of predetermined step size from a predetermined first voltage to a predetermined second voltage.

STEP 720: Set current voltage step equal to the predetermined first voltage.

STEP 730: Inhibiting those memory cells in the group with program voltage estimates below the current voltage step and not inhibiting the other memory cells in the group with program voltage estimates at or above the current voltage step.

STEP 732: Programming the group of memory cells by applying to the word line the current voltage step.

STEP 734: Is current voltage step equal to the predetermined second voltage? If so proceed to STEP 750, otherwise proceed to STEP 740.

STEP 740: Set current voltage step equal to the next step down. Proceed to STEP 730.

STEP 750: Programming pass done for the group.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A method of programming a group of memory cells in parallel, comprising:
   providing a word line for accessing the group of memory cells in parallel and a bit line for accessing each respective memory cell of the group;
   for each memory cell in the group to be programmed to a respective target, providing a program voltage estimate expected to program the memory cell to the respective target;
   providing a programming voltage as a series of decrementing voltage steps; and
   programming the group of memory cells by applying a current voltage step of the programming voltage to the word line, step by step from a predetermined highest step to a predetermined lowest step while at the current step keep inhibiting those memory cells with program voltage estimates below the current voltage step and not inhibiting the other memory cells with program voltage estimates at or above the current voltage step.

2. The method as in claim 1, wherein:
   said programming step by step is performed without a verify step on the group of memory cells in between each step.

3. The method as in claim 1, wherein:
   said inhibiting those memory cells at each step includes applying a first voltage to the bit lines of those memory cells; and
   said not inhibiting the other memory cells includes applying a second voltage to the bit lines of the other memory cells.

4. The method as in claim 3, wherein:
   said not inhibiting the other memory cells includes changing the voltage on the bit lines of the other memory cells from the first voltage to the second voltage.

5. The method as in claim 3, wherein:
   said first voltage enables the memory cell to be program-inhibited.

6. The method as in claim 3, wherein:
   said first voltage is substantially at a system supply voltage, Vdd.

7. The method as in claim 3 wherein:
   said second voltage enables the memory cell to be program-enabled.

8. The method as in claim 3, wherein:
   said second voltage is at substantially at 0V.

9. The method as in claim 1, wherein:
   said program voltage estimate is derived from a previous programming experience on the group of memory cells.

10. The method as in claim 1, wherein:
    before the current step, un-inhibiting those memory cells of the group with programming voltage estimates at or above the current program voltage step;
    programming the group of memory cells by applying the current program voltage step to the word line; and
    repeating the un-inhibiting and the programming until the after the completion of the predetermined lowest step.

11. A nonvolatile memory, comprising:
    an array of memory cells;
    read/write circuits for reading and programming a group of memory cells in parallel, wherein each memory cell is programmable to a respective target state;

a word line for accessing the group of memory cells in parallel and a bit line for coupling a read/write circuit to each respective memory cell of the group;

a program voltage estimate for each memory cell expected to program each memory cell to a respective target;

a programming voltage as a series of decrementing voltage steps;

said read/write circuits performing programming on the group of memory cells that comprises:

applying a current voltage step of the programming voltage to the word line, step by step from a predetermined highest step to a predetermined lowest step while at the current step keep inhibiting those memory cells with program voltage estimates below the current voltage step and not inhibiting the other memory cells with program voltage estimates at or above the current voltage step.

12. The nonvolatile memory as in claim 11, wherein:
said read/write circuits performs the programming step by step without a verify in between each step.

13. The nonvolatile memory as in claim 11, wherein:
said read/write circuits applies at each step a first voltage to the bit lines of those memory cells to inhibiting those memory cells; and
said read/write circuits applies a second voltage to the bit lines of the other memory cells to not inhibit the other memory cells.

14. The nonvolatile memory as in claim 13, wherein:
said read/write circuits changes the voltage on the bit lines of the other memory cells from the first voltage to the second voltage to not inbhit the other memory cells.

15. The nonvolatile memory as in claim 13, wherein:
said first voltage enables the memory cell to be program-inhibited.

16. The nonvolatile memory as in claim 13, wherein:
said first voltage is substantially at a system supply voltage, Vdd.

17. The nonvolatile memory as in claim 13 wherein:
said second voltage enables the memory cell to be program-enabled.

18. The nonvolatile memory as in claim 13, wherein:
said second voltage is at substantially at 0V.

19. The nonvolatile memory as in claim 11, wherein:
said program voltage estimate is derived from a previous programming experience on the group of memory cells.

20. The nonvolatile memory as in claim 11, wherein:
said read/write circuits before the current step, un-inhibits those memory cells of the group with programming voltage estimates at or above the current program voltage step;
programs the group of memory cells by applying the current program voltage step to the word line; and
repeats the un-inhibiting and the programming until the after the completion of the predetermined lowest step.

* * * * *